United States Patent
Sakai et al.

(10) Patent No.: US 12,144,122 B2
(45) Date of Patent: Nov. 12, 2024

(54) METHOD OF MANUFACTURING PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP); MEC COMPANY LTD., Hyogo (JP)

(72) Inventors: Shoichiro Sakai, Osaka (JP); Ryuta Ohsuka, Osaka (JP); Koji Nitta, Osaka (JP); Yoshihito Yamaguchi, Shiga (JP); Masaharu Yasuda, Osaka (JP); Akira Tsuchiko, Osaka (JP); Koji Kasuya, Osaka (JP); Kenji Nishie, Hyogo (JP); Yu Fukui, Hyogo (JP)

(73) Assignees: SUMITOMO ELECTRIC INDUSTRIES. LTD., Osaka (JP); SUMITOMO ELECTRIC: PRINTED CIRCUITS, INC., Shiga (JP); MEC COMPANY LTD., Hyogo (JP)

( * ) Notice: Subject to any disclaimer, the term of this patent is extended or adjusted under 35 U.S.C. 154(b) by 244 days.

(21) Appl. No.: 17/998,966

(22) PCT Filed: Nov. 16, 2021

(86) PCT No.: PCT/JP2021/042117
§ 371 (c)(1),
(2) Date: Nov. 16, 2022

(87) PCT Pub. No.: WO2022/113831
PCT Pub. Date: Jun. 2, 2022

(65) Prior Publication Data
US 2023/0232540 A1    Jul. 20, 2023

(30) Foreign Application Priority Data
Nov. 24, 2020   (JP) ................ 2020-194324

(51) Int. Cl.
*H05K 1/03*   (2006.01)
*C22C 19/05*   (2006.01)
(Continued)

(52) U.S. Cl.
CPC ............ *H05K 3/103* (2013.01); *C22C 19/05* (2013.01); *H05K 1/0373* (2013.01);
(Continued)

(58) Field of Classification Search
CPC .... H05K 3/103; H05K 1/0373; H05K 3/1258; H05K 2203/0212
See application file for complete search history.

(56) References Cited

U.S. PATENT DOCUMENTS

2011/0278261 A1    11/2011 Himi et al.

FOREIGN PATENT DOCUMENTS

| JP | 2004-006773 | 1/2004 |
| JP | 2011-236467 | 11/2011 |

(Continued)

OTHER PUBLICATIONS

U.S. Appl. No. 17/998,980, filed Nov. 16, 2022.

*Primary Examiner* — Jeremy C Norris
(74) *Attorney, Agent, or Firm* — IPUSA, PLLC

(57) ABSTRACT

In manufacturing a printed circuit board using a semi-additive method, a removal liquid that has been used in removing a nickel-chromium-containing layer (5) is regenerated by contacting the removal liquid with a chelate resin having a functional group represented by a following formula (1):

(Continued)

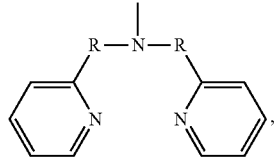

(1)

where a plurality of Rs are identical divalent hydrocarbon groups having 1 to 5 carbons, and a portion of hydrogen atoms may be substituted with halogen atoms.

6 Claims, 5 Drawing Sheets

(51) Int. Cl.
*H05K 3/10* (2006.01)
*H05K 3/12* (2006.01)

(52) U.S. Cl.
CPC ... *H05K 3/1258* (2013.01); *H05K 2201/0212* (2013.01); *H05K 2203/061* (2013.01); *H05K 2203/176* (2013.01)

(56) References Cited

FOREIGN PATENT DOCUMENTS

| | | |
|---|---|---|
| JP | 2013-188720 | 9/2013 |
| JP | 2014-075490 | 4/2014 |

METHOD OF MANUFACTURING PRINTED CIRCUIT BOARD

TECHNICAL FIELD

The present disclosure relates to a method of manufacturing a printed circuit board.

The present application is based on and claims priority to Japanese Application No. 2020-194324 filed on Nov. 24, 2020, the contents of which are incorporated herein by reference in their entirety.

BACKGROUND ART

With reduction in size and weight of electronic devices, wiring portions of printed circuit boards have been reduced in size. As a method of reducing the size of a wiring portion of a printed circuit board, for example, a seed layer is formed on a surface of an insulating resin layer, a portion other than a portion forming a circuit is covered with a plating resist, and a copper plating layer is selectively formed only on the circuit portion by electroplating. Then, after removing the plating resist, the seed layer other than the circuit portion is removed, and a printed circuit board is formed (see Japanese Laid-Open Patent Publication No. 2004-6773).

CITATION LIS

Patent Literature

[PTL 1]
Japanese Laid-Open Patent Publication No. 2004-6773

SUMMARY OF INVENTION

According to one aspect of the present disclosure, a method of manufacturing a printed circuit board having a conductive pattern that includes a plurality of wiring portions is provided. The method includes: providing an insulating base film in which a nickel-chromium-containing layer is laminated directly or indirectly on a surface; laminating a resist pattern directly or indirectly on a surface of the nickel-chromium-containing layer, after providing the base film; laminating a copper plating layer by plating on a part of the surface of the nickel-chromium-containing layer in which the resist pattern is not laminated, after laminating the resist pattern; removing the resist pattern, after laminating the copper plating layer; removing, using a removal liquid, a part of the nickel-chromium-containing layer in which the copper plating layer is not laminated, after removing the resist pattern; and regenerating the removal liquid that has been used in removing the nickel-chromium-containing layer, by contacting the removal liquid with a chelate resin, wherein the chelate resin includes a functional group represented by a following formula (1).

[Chem 1]

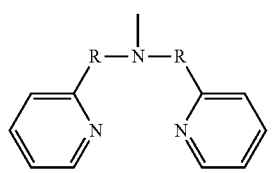

(In formula (1), the Rs are identical divalent hydrocarbon groups having 1 to 5 carbons. A portion of the hydrogen atoms in the hydrocarbon groups may be substituted with halogen atoms.)

According to another aspect of the present disclosure, a method of manufacturing a printed circuit board having a conductive pattern that includes a plurality of wiring portions is provided. The method includes: providing an insulating base film in which a nickel-chromium-containing layer is laminated directly or indirectly on a surface; laminating a resist pattern directly or indirectly on a surface of the nickel-chromium-containing layer, after providing the base film; laminating a copper plating layer by plating on a part of the surface of the nickel-chromium-containing layer in which the resist pattern is not laminated, after laminating the resist pattern; removing the resist pattern, after laminating the copper plating layer; and removing, using a regenerated removal liquid, a part of the nickel-chromium-containing layer in which the copper plating layer is not laminated, after removing the resist pattern, wherein the regenerated removal liquid has been regenerated by contacting with a chelate resin, the chelate resin being a functional group represented by a following formula (1).

[Chem 2]

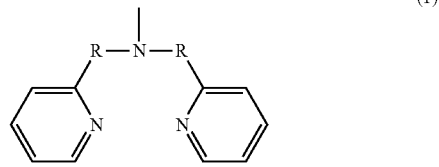

(In formula (1), the Rs are identical divalent hydrocarbon groups having 1 to 5 carbons. A portion of the hydrogen atoms in the hydrocarbon groups may be substituted with halogen atoms.)

In the present disclosure, "an insulating base film in which a nickel-chromium-containing layer is laminated directly on a surface" refers to an insulating base film in which the nickel-chromium-containing layer is laminated directly above the surface. "An insulating base film in which a nickel-chromium-containing layer is laminated indirectly on a surface" refers to an insulating base film in which the nickel-chromium-containing layer is laminated directly above the surface via one or more other layers, such as a conductive layer. "Laminate a resist pattern directly on a surface of a nickel-chromium containing layer" refers to laminating a resist pattern directly above the nickel-chromium containing layer. "Laminate a resist pattern indirectly on a surface of a nickel-chromium containing layer" refers to laminating a resist pattern layer directly above the nickel-chromium containing layer via one or more other layers, such as a conductive layer.

DESCRIPTION OF EMBODIMENTS

Technical Problem

Figure 1:
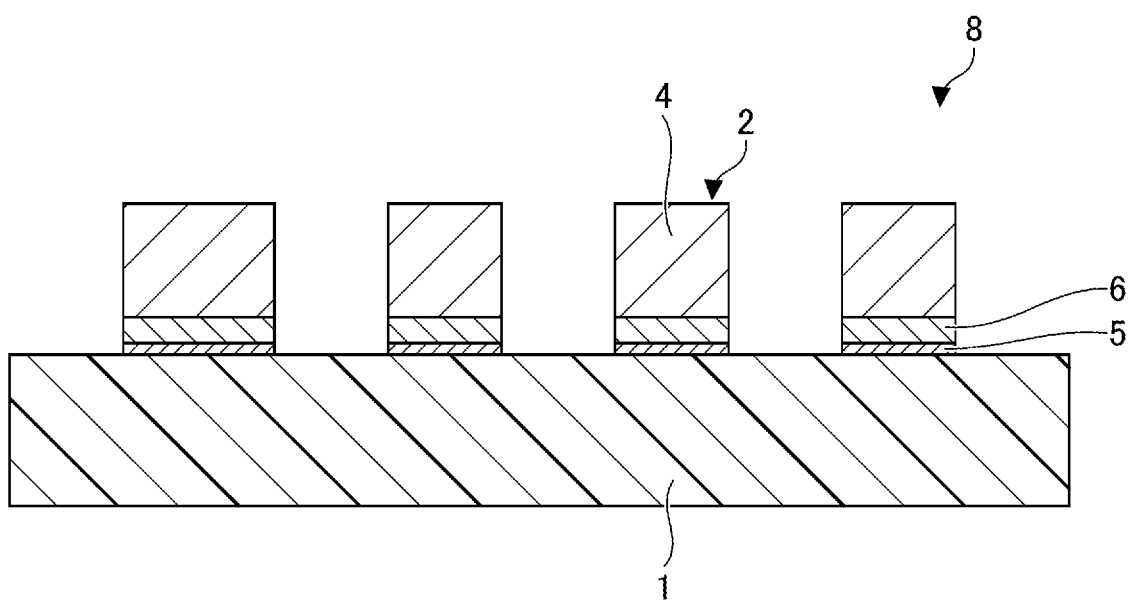
FIG. 1 is a schematic cross-sectional view of a printed circuit board manufactured by a method of manufacturing a printed circuit board according to an embodiment of the present disclosure.

When manufacturing a printed circuit board, for example, a seed layer is formed on a substrate, and a copper plating layer and the like is laminated on the seed layer. Examples of the seed layer include a layer containing nickel and chromium. The seed layer is partially removed during manufacturing using, typically, a nickel-chromium-containing layer removal liquid. The nickel-chromium-containing layer removal liquid is a liquid that removes the nickel-chromium-containing layer. Hereinafter, the nickel-chromium-containing layer removal liquid may be simply referred to as a removal liquid. The removal liquid cannot be used repeatedly. This is because when the seed layer is immersed in the removal liquid, the metal components of other layers of the printed circuit board dissolve in the removal liquid, the metal concentration in the removal liquid increases, and as a result, the etching performance deteriorates.

In particular, when a fine printed circuit board is manufactured, deterioration of etching performance causes peeling of wiring portions, and as a result, the performance of circuit board is affected.

The present disclosure is made based on such circumstances, and an object of the present disclosure is to provide a method of manufacturing a printed circuit board that can extend the life of the removal liquid and can avoid the peeling of the wiring portion, using a regenerated removal liquid obtained by regenerating the removal liquid.

Advantageous Effects of Invention

According to the present disclosure, it is possible to recycle the used removal liquid, and the life of the removal liquid can be extended.

Description of Embodiment of Present Disclosure

First, embodiments of the present disclosure will be listed and described.

A method of manufacturing a printed circuit board according to the present disclosure is a method of manufacturing a printed circuit board having a conductive pattern that includes a plurality of wiring portions, the method including: providing an insulating base film in which a nickel-chromium-containing layer is laminated directly or indirectly on a surface; laminating a resist pattern directly or indirectly on a surface of the nickel-chromium-containing layer, after providing the base film; laminating a copper plating layer by plating on a part of the surface of the nickel-chromium-containing layer in which the resist pattern is not laminated, after laminating the resist pattern; removing the resist pattern, after laminating the copper plating layer; removing, using a removal liquid, a part of the nickel-chromium-containing layer in which the copper plating layer is not laminated, after removing the resist pattern; and regenerating the removal liquid that has been used in removing the nickel-chromium-containing layer, by contacting the removal liquid with a chelate resin, wherein the chelate resin includes a functional group represented by the following formula (1).

[Chem 3]

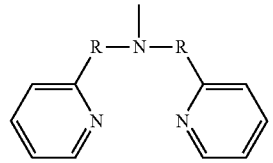

(1)

(In formula (1), the Rs are identical divalent hydrocarbon groups having 1 to 5 carbons. A portion of the hydrogen atoms in the hydrocarbon groups may be substituted with halogen atoms.)

The removal liquid used for removing the nickel-chromium-containing layer typically includes hydrochloric acid, sulfuric acid, and the like. In addition to nickel and chromium, copper in the wiring portion also slightly dissolves in the removal liquid. The higher the concentration of copper ions in the liquid, the faster the copper dissolves. Therefore, the lifetime of the removal liquid is determined by the concentration of copper ions in the removal liquid. The inventors of the present invention considered that it is necessary to maintain the concentration of copper ions in the removal liquid at a low level in order to extend the life of the removal liquid and to prevent the peeling of the manufactured circuit, and conducted an intensive investigation. As a result, it was found that, by contacting the removal liquid with a chelate resin having a functional group represented by the above formula (1), the copper ions in the removal liquid can be adsorbed by the chelate resin. The method of manufacturing the printed circuit board includes, after removing the nickel-chromium-containing layer, regenerating the removal liquid that has been used, by contacting the removal liquid with a chelate resin that includes a functional group represented by the above formula (1). Because the concentration of copper ions in the removal liquid obtained by regeneration is reduced, the removal liquid can be recycled as a regenerated removal liquid, and the lifetime of the removal liquid can be extended.

It is preferable to further include: laminating a conductive layer on the surface of the nickel-chromium-containing layer, after providing the base film and before laminating the resist pattern; and removing the conductive layer, after removing the resist pattern and before removing the nickel-chromium-containing layer. By laminating the conductive layer on the surface of the nickel-chromium-containing layer, sufficient current can be applied as a cathode in the subsequent step of laminating the copper plating layer.

It is preferable that, in the regenerated removal liquid, which is obtained in regenerating the removal liquid that has been used, includes chloride ions and copper ions are contained, the pH is 1 or less, and the concentration of the copper ions is 1 ppm or more and 2,000 ppm or less. According to the embodiment, the effect of removing nickel and chromium can be well maintained. When the regenerated removal liquid has a strong acidity of pH 1 or less, the effect of removing the nickel-chromium-containing layer can be further improved. Further, when the concentration of the copper ions of the regenerated removal liquid is in the range described above, it is possible to maintain the concentration of the copper ions of the regenerated removal liquid at a low level while improving the effect of removing the nickel-chromium-containing layer, and to increase the effect of preventing peeling of the wiring portion and preventing a short circuit due to a fall of the wiring portion.

In the method of manufacturing a printed circuit board according to the present disclosure, it is preferable that the regenerated removal liquid obtained in regenerating the removal liquid that has been used further contains a pyridine-based compound, and the concentration of the pyridine-based compound is more than 0 ppm and 5,000 ppm or less. According to the embodiment, the effect of removing nickel and chromium can be well maintained. In the removal liquid, a part of the chelate resin that includes a functional group represented by the above formula (1) is decomposed and a pyridine-based compound is formed as an impurity. The inventors of the present invention have found that this impurity inhibits the removal of the nickel-chromium-containing layer. When the concentration of the pyridine-based compound in the regenerated removal liquid is 5,000 ppm or less, the effect of inhibiting the removal of nickel and chromium by the pyridine-based compound can be reduced, and thus the effect of removing nickel and chromium can be well maintained.

According to the present disclosure, it is preferable that the functional group is a bis (2-pyridylmethyl) amino group. When the chelate resin has a functional group represented by the above formula (1), the effect of removing the nickel-chromium-containing layer can be further improved.

Another method of manufacturing a printed circuit board according to the present disclosure is a method of manufacturing a printed circuit board having a conductive pattern that includes a plurality of wiring portions, the method including: providing an insulating base film in which a nickel-chromium-containing layer is laminated directly or indirectly on a surface; laminating a resist pattern directly or indirectly on a surface of the nickel-chromium-containing layer, after providing the base film; laminating a copper plating layer by plating on a part of the surface of the nickel-chromium-containing layer in which the resist pattern is not laminated, after laminating the resist pattern; removing the resist pattern, after laminating the copper plating layer; and removing, using a regenerated removal liquid, a part of the nickel-chromium-containing layer in which the copper plating layer is not laminated, after removing the resist pattern, wherein the regenerated removal liquid has been regenerated by contacting with a chelate resin, the chelate resin being a functional group represented by a following formula (1).

[Chem 4]

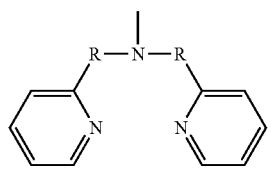

(1)

(In formula (1), the Rs are identical divalent hydrocarbon groups having 1 to 5 carbons. A portion of the hydrogen atoms in the hydrocarbon groups may be substituted with halogen atoms.)

The method of manufacturing the printed circuit board includes the step of removing, using a regenerated removal liquid, a part of the nickel-chromium-containing layer in which the copper plating layer is not laminated. Accordingly, recycle of the removal liquid that has been used is attempted. In the method of manufacturing the printed circuit board, the regenerated removal liquid is regenerated by contacting the removal liquid that has been used with the chelate resin. Accordingly, copper ions in the removal liquid that has been used are adsorbed by the chelate resin. As a result, because the concentration of the copper ions in the regenerated removal liquid is reduced, it is possible to improve the effect of removing the nickel-chromium-containing layer while preventing the progress of dissolution of the copper contained in the wiring portion in the step of removing the nickel-chromium-containing layer. As a result, it is possible to manufacture a printed circuit board in which peeling of the wiring portion is prevented using the regenerated removal liquid. This enables efficient use of the regenerated removal liquid that has been used and reduction of manufacturing costs.

In the present disclosure, "surface" refers to, in a printed circuit board viewed from the center of the thickness direction of the base film, outer surfaces in the thickness direction, and does not limit the vertical relationship when the printed circuit board is manufactured or used. The term "removal liquid that has been used (or, regenerated removal liquid that has been used)" in the present disclosure refers to a removal liquid in which the concentration of copper ions is higher than that of an unused removal liquid because the removal liquid is used at least once in the step of removing the nickel-chromium-containing layer. When the concentration of copper ions contained in the regenerated removal liquid that has been used is lower than a predetermined concentration, the regenerated removal liquid that has been used may not be contacted with the chelate resin.

DETAILS OF EMBODIMENTS OF PRESENT DISCLOSURE

Hereinafter, a method of manufacturing a printed circuit board according to an embodiment of the present disclosure will be described in detail with reference to the drawings.
<Method of Manufacturing Printed Circuit Board>

First Embodiment

A method of manufacturing a printed circuit board according to a first embodiment of the present disclosure is, as illustrated in FIG. 1, a method of manufacturing a printed circuit board 8 including an insulating base film 1 and a conductive pattern that includes a plurality of wiring portions 2 formed on at least one side of the base film 1.

In the printed circuit board 8 manufactured by the method of manufacturing the printed circuit board, the wiring portion 2 includes a nickel-chromium-containing layer 5 that is laminated on the surface of the base film 1 and a copper plating layer 4 that is laminated on the surface of the nickel-chromium-containing layer 5 by copper plating. The method of manufacturing the printed circuit board is particularly suitable for manufacturing a fine pitch printed circuit board having a small width of a plurality of wiring portions 2 and being disposed at a narrow pitch. The nickel-chromium-containing layer 5 improves the adhesion, or removal strength, between the base film 1 and the wiring portion 2. The printed circuit board 8 may be laminated on the surface of the nickel-chromium-containing layer 5. The printed circuit board 8 may include a conductive layer 6 formed of the same type of metal as the copper plating layer 4, that is, copper.

Figure 2:
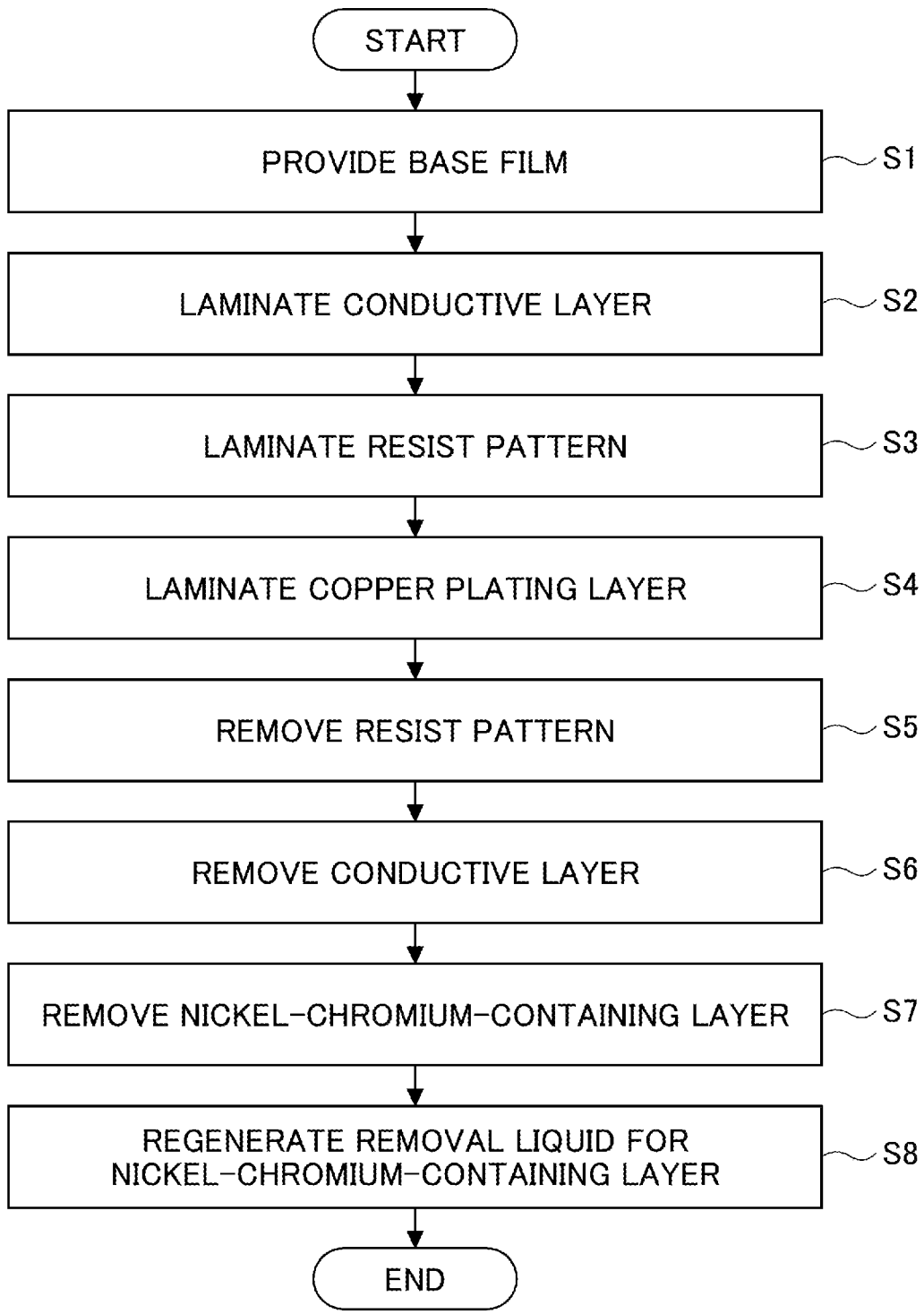
FIG. 2 is a flow chart illustrating a procedure of a method of manufacturing a printed circuit board according to an embodiment of the present disclosure.

FIG. 2 illustrates a procedure of the method of manufacturing the printed circuit board. As the method of manufacturing the printed circuit board, a semi-additive method is used. The method of manufacturing a printed circuit board includes: providing an insulating base film in which a nickel-chromium-containing layer is laminated directly or indirectly on a surface (step S1); laminating a resist pattern directly or indirectly on a surface of the nickel-chromium-containing layer, after providing the base film (step S3); laminating a copper plating layer by plating on a part of the surface side of the nickel-chromium-containing layer in which the resist pattern is not laminated, after laminating the resist pattern (step S4); removing the resist pattern, after laminating the copper plating layer (step S5); removing, using a removal liquid, a part of the nickel-chromium-containing layer in which the copper plating layer is not laminated, after removing the resist pattern (step S7); and regenerating the removal liquid that has been used in removing the nickel-chromium-containing layer, by contacting the removal liquid with a chelate resin (step S8). Preferably, the method of manufacturing the printed circuit board further include the step (step S2) of: laminating a conductive layer directly or indirectly on the surface of the nickel-chromium-containing layer, after providing the base film (step S1). When the conductive layer is formed, it is preferable to include the step (step S6) of: removing the conductive layer, after removing the resist pattern (step S5).

[Providing Base Film]

In the step of providing the base film of step S1, film in which a nickel-chromium containing layer is laminated is provided. The base film has an insulating property and has a nickel-chromium containing layer 5 directly or indirectly laminated on the surface. The nickel-chromium-containing layer 5 contains nickel and chromium, thereby providing excellent adhesion with the base film 1. Examples of laminating method of the nickel-chromium-containing layer 5 include electroless plating, sputtering, deposition, coupling agent coating, and the like.

(Base Film)

The base film 1 is composed mainly of synthetic resin and has an electrical insulating property. The base film 1 is a base film for forming a conductive pattern. The base film 1 may be flexible. When the base film 1 is flexible, the printed circuit board 8 can be used as a flexible printed circuit board.

Examples of the synthetic resin include polyimide, polyethylene terephthalate, liquid crystal polymer, fluorine resin, and the like.

When the printed circuit board 8 is used as a flexible printed circuit board, the lower limit of the average thickness of the base film 1 is preferably 5 μm and more preferably 10 μm. The upper limit of the average thickness of the base film 1 is preferably 50 μm and more preferably 40 μm. When the average thickness of the base film 1 is less than the lower limit, the insulation strength of the base film 1 may be insufficient. When the average thickness of the base film 1 exceeds the upper limit, there is a risk that the printed circuit board may be unnecessarily thick or the flexibility may be insufficient. "Average thickness" refers to an average value of the thickness measured at freely-selected five points.

In the step of providing the base film of step S1, the base film 1 on which the nickel-chromium-containing layer 5 is laminated on the surface is provided. The nickel-chromium-containing layer 5 is preferably highly adhesive to the base film 1 and the conductive layer 6.

The lower limit of the average thickness of the nickel-chromium-containing layer 5 is preferably 2 nm and more preferably 4 nm. The upper limit of the average thickness of the nickel-chromium-containing layer 5 is preferably 30 nm and more preferably 20 nm. When the average thickness of the nickel-chromium-containing layer 5 is less than the lower limit, sufficient adhesion may not be exhibited. When the average thickness of the nickel-chromium-containing layer 5 exceeds the upper limit, manufacturing costs may increase unnecessarily.

[Laminating Conductive Layers]

Figure 3:
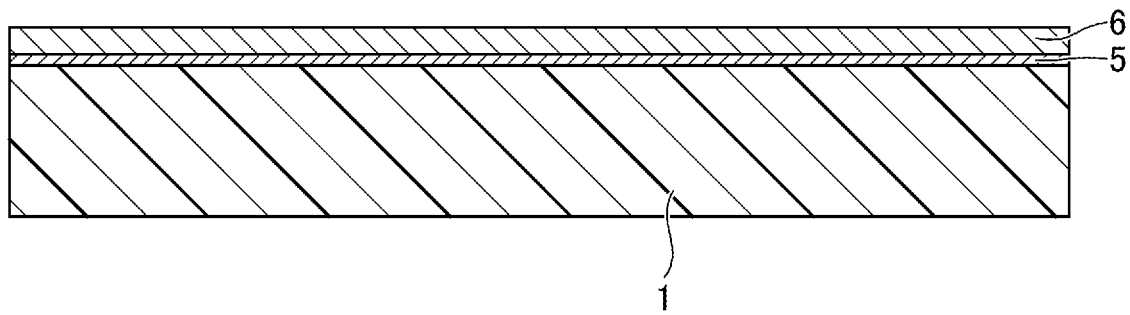
FIG. 3 is a schematic cross-sectional view explaining a step of laminating a conductive layer according to the method of manufacturing a printed circuit board of FIG. 2.

In the step of laminating the conductive layer of step S2, as illustrated in FIG. 3, the conductive layer 6 is laminated on the surface of the nickel-chromium-containing layer 5. The conductive layer 6 can pass a sufficient current as a cathode in the step of laminating the copper plating layer in the later step S4.

The conductive layer 6 is preferably formed of the same type of metal as the copper plating layer 4 so that the adhesion of the conductive layer 6 to the copper plating layer 4 can be improved and the wiring of the wiring portion 2 can be formed integrally with the copper plating layer 4 in the obtained printed circuit board 8. As the material of the conductive layer 6, for example, metals such as copper, silver, platinum, nickel, and the like may be used, and among these, copper having low electrical resistance and low cost is preferable.

A lower limit of the average thickness of the laminated conductive layer 6 is preferably 50 nm and more preferably 100 nm. The upper limit of the average thickness of the conductive layer 6 is preferably 2 μm and more preferably 1.5 μm. When the average thickness of the conductive layer 6 is less than the lower limit, there is a risk that the conductivity of the conductive layer 6 is insufficient and the surface of the copper plating layer 4 laminated thereon cannot be smoothed. When the average thickness of the conductive layer 6 exceeds the upper limit, erosion of the copper plating layer 4 in the step of removing the nickel-chromium-containing layer of step S6 may be unnecessarily increased.

Examples of laminating method of the conductive layer 6 include electroless plating, coating, drying, and sintering of a dispersion liquid of fine metal particles, sputtering, deposition, and the like. Among these, as the laminating method of the conductive layer 6, it is preferable to adopt the method of coating, drying, and sintering of a dispersion liquid of fine metal particles, which is capable of laminating the conductive layer 6 having a sufficient thickness to ensure electrical conductivity relatively easily and inexpensively.

The dispersion liquid of fine metal particles described above is preferably a liquid containing metal particles forming the conductive layer 6, a dispersion medium for the fine metal particles, and a dispersant for uniformly dispersing the fine metal particles in the dispersion medium. By using the dispersion liquid of fine metal particles in which the fine metal particles are uniformly dispersed, the fine metal particles can be uniformly adhered to the surface of the nickel-chromium-containing layer 5, and the uniform conductive layer 6 can be laminated.

In the method of applying the dispersion liquid of fine metal particles to the surface of the nickel-chromium-containing layer 5, for example, a conventional coating method known in the art, such as a spin-coating method, a spray-coating method, a bar-coating method, a die-coating method, a slit-coating method, a roll-coating method, a dip-coating method, and the like, may be used. For example, the dispersion liquid of fine metal particles may be partially coated using screen printing, dispenser, and the like.

The shorter the drying time of the coating film of the dispersion liquid of fine metal particles, the smaller the porosity of the conductive layer 6 obtained by sintering the coating film. Therefore, it is preferable that the drying of the dispersion liquid of fine metal particles is promoted by heating or blowing, and it is more preferable that the coating film is dried by blowing hot air onto the coating film of the dispersion liquid of fine metal particles. The temperature of the hot air is preferably such that the solvent of the dispersion liquid of fine metal particles does not boil. Specifically, the temperature of the hot air may be, for example, 30° C. or more and 80° C. or less.

By heating the coating film of the dried dispersion liquid of fine metal particles, the dispersant and various additives in the dispersion liquid of fine metal particles evaporate or decomposed by heat, and the remaining fine metal particles are sintered to laminate the conductive layer 6.

The heating temperature when sintering the coating film of the dispersion liquid of fine metal particles is appropriately selected depending on the material of the fine metal particles, and the like, and is, for example, 150° C. or more and 500° C. or less.

[Laminating Resist Pattern]

Figure 4:
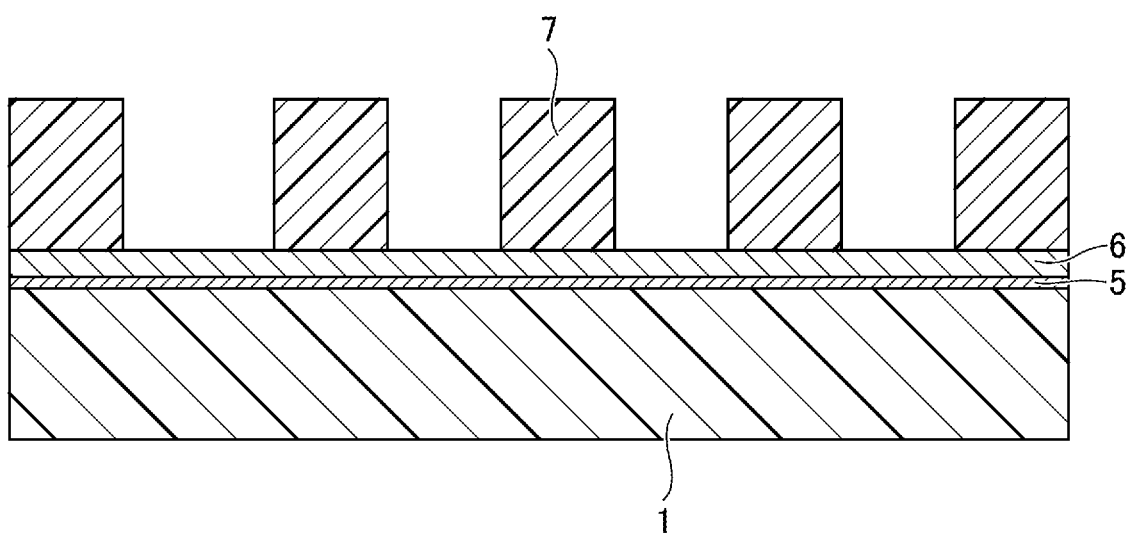
FIG. 4 is a schematic cross-sectional view explaining a step of laminating a resist pattern directly or indirectly according to the method of manufacturing a printed circuit board of FIG. 2.

In the step of laminating the resist pattern of step S3, after the step of providing the base film, the resist pattern is directly or indirectly laminated on the surface of the nickel-chromium-containing layer. The resist pattern 7 has an inverted shape of the conductive pattern. In the step of laminating the resist pattern, the resist pattern 7 is laminated on the surface of the conductive layer 6 by a photolithographic technique as illustrated in FIG. 4.

Examples of the method of laminating a resist film include a method of coating and drying a liquid resist composition, a method of thermocompression bonding of a sheet resist composition, and the like. The sheet resist composition is, for example, a dry film. As a material of the resist film, a material commercially available as a resist material for plating, such as, for example, a material having an acrylic resin as a main component, can be used.

The opening of the resist pattern 7 corresponds to the width of the wiring portion 2 in the conductive pattern. The lower limit of the average width of the opening is not particularly limited, but preferably 5 µm and more preferably 6 µm. The upper limit of the average width of the opening is preferably 20 µm and more preferably 15 µm. When the average width of the opening of the resist pattern 7 is in the range described above, the effect of the method of manufacturing the printed circuit board as a fine pitch circuit can be further exhibited.

[Laminating Copper Plating Layer]

Figure 5:
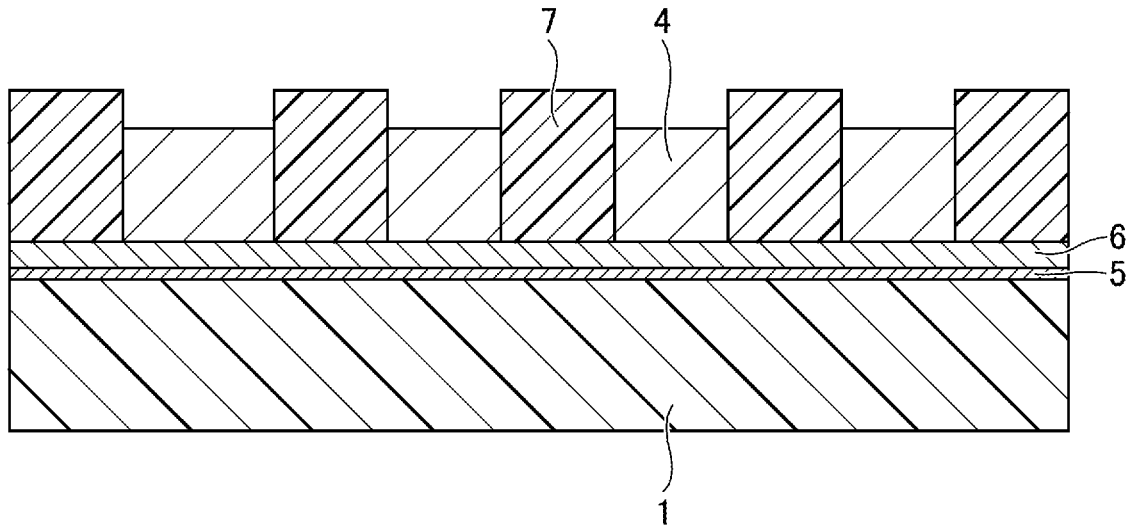
FIG. 5 is a schematic cross-sectional view explaining a step of laminating a copper plating layer according to the method of manufacturing a printed circuit board of FIG. 2.

In the step of laminating the copper plating layer of step S4, after the step of laminating the resist pattern, the copper plating layer 4 is laminated by plating on a part of the surface of the nickel-chromium-containing layer 5 in which the resist pattern 7 is not laminated. When the conductive layer 6 is laminated in step S2, the copper plating layer 4 is laminated on a part of the surface of the conductive layer 6 in which the resist pattern 7 is not laminated. In the step of laminating the copper plating layer 4, the copper plating layer 4 is laminated on the surface of the conductive layer 6 exposed from the resist pattern as illustrated in FIG. 5 by electroplating the nickel-chromium-containing layer 5 and the conductive layer 6 as cathodes. The area exposed from the resist pattern on the surface of the conductive layer 6 is the area corresponding to the opening of the resist pattern 7.

The metal laminated by plating is copper. The copper has a low electrical resistance and is inexpensive. By using the same type of metal as the metal that forms the conductive layer 6, it can be integrated with the conductive layer 6.

The plating liquid used in the step of laminating the copper plating layer is not particularly limited. For example, a conventional copper plating liquid containing copper sulfate, copper pyrophosphate, and the like may be used.

It is preferable that the line and space L/S in the conductive pattern is 5 µm/5 µm or more and 20 µm/20 µm or less. According to the method of manufacturing the printed circuit board, a fine printed circuit board capable of preventing peeling of the wiring portion and short circuit even when the printed circuit board has a fine pitch circuit such that line and space is L/S=10/10 or less, can be obtained. Accordingly, in the method of manufacturing the printed circuit board, when the line and space L/S in the conductive pattern is in the range described above, it is possible to exhibit a better effect of preventing against peeling and short circuit of the wiring portion as the fine pitch circuit. Here, "line and space" refers to the width [µm] of the wiring portion and the gap [µm] between the wiring portions in the conductive pattern.

[Removing Resist Pattern]

Figure 6:
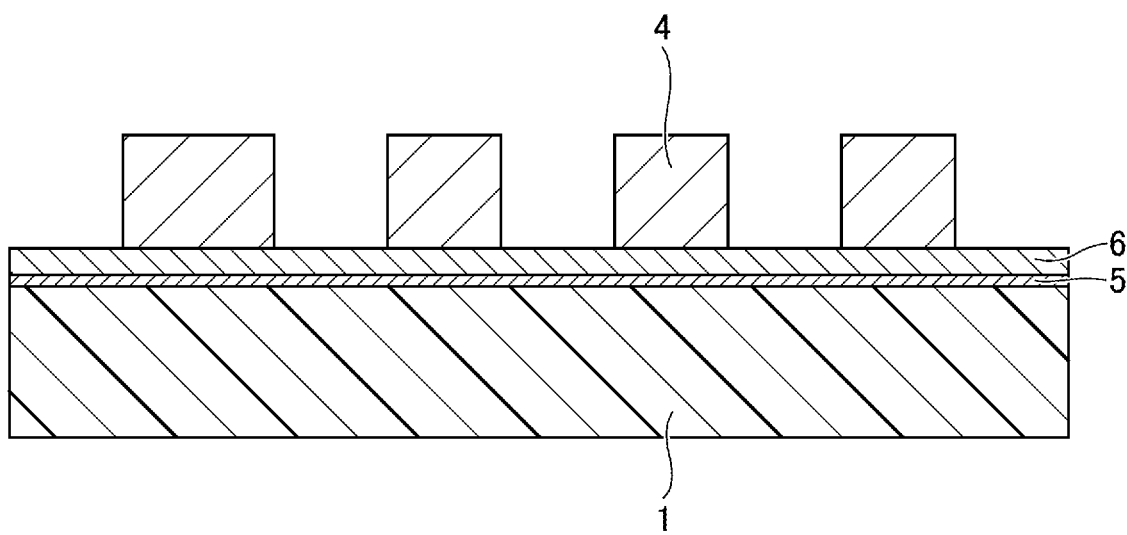
FIG. 6 is a schematic cross-sectional view explaining a step of removing the resist pattern according to the method of manufacturing a printed circuit board of FIG. 2.

After the step of laminating the copper plating layer, in the step of removing the resist pattern of step S5, the resist pattern 7 is removed. In the step of removing the resist pattern, as illustrated in FIG. 6, the resist pattern 7 is dissolved and removed using a resist removal liquid.

As the resist removal liquid, a liquid that dissolves the resist pattern 7 but does not dissolve the base film 1, the nickel-chromium-containing layer 5, the conductive layer 6, and the copper plating layer 4, is used. As the resist removal liquid, for example, a conventional removal liquid containing mainly 2-amine ethanol, tetramethylammonium hydroxide, organic acid, and the like may be used.

[Removing Conductive Layer]

Figure 7:
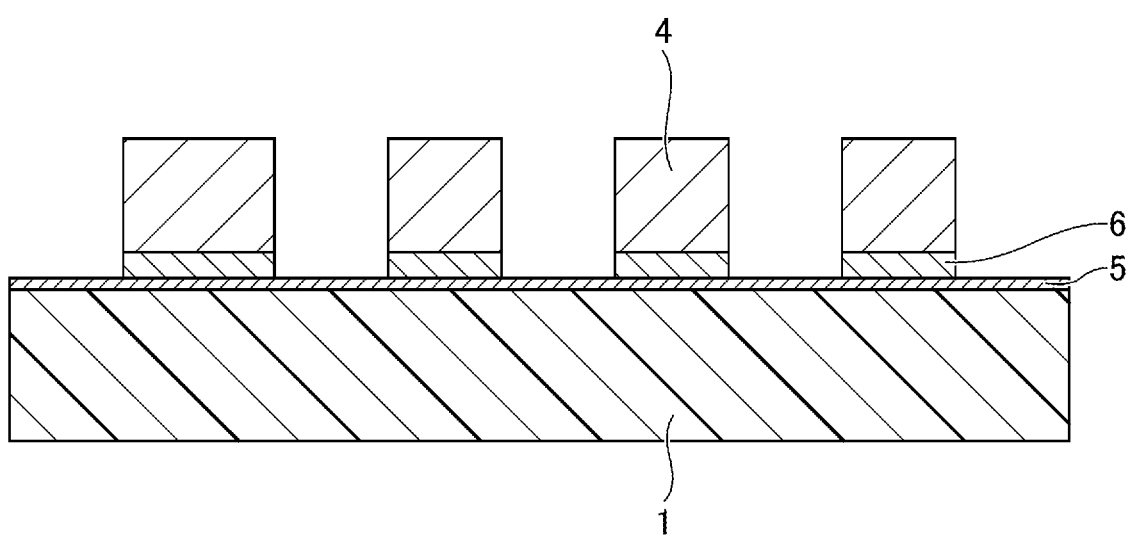
FIG. 7 is a schematic cross-sectional view explaining a step of removing the conductive layer according to the method of manufacturing a printed circuit board of FIG. 2.

In the step of removing the conductive layer of step S6, the conductive layer 6 exposed by the removal liquid is dissolved and removed. In the step of removing the conductive layer of step S6, as illustrated in FIG. 7, the exposed area of the conductive layer 6 is removed.

As a removal liquid for removing the conductive layer used in the step of removing the conductive layer, for example, an aqueous solution of sulfuric acid and hydrogen peroxide may be used. The aqueous solution of sulfuric acid and hydrogen peroxide may be also called a piranha solution.

[Removing Nickel-Chromium-Containing Layer]

In the step of removing the nickel-chromium-containing layer of step S7, after the step of removing the conductive layer, a part of the nickel-chromium-containing layer 5 in which the copper plating layer 4 is not laminated, that is, the exposed area of the nickel-chromium-containing layer 5, is removed, using a removal liquid. In this step, a removal liquid that erodes nickel and chromium is used, and the nickel-chromium-containing layer 5 is dissolved and removed. A method of dissolving may be, for example, storing the removal liquid in a liquid bath and immersing the substrate in the removal liquid. As the removal liquid, an unused removal liquid may be used, or a regenerated removal liquid described later may be used. The embodiment in which the regenerated removal liquid is used will be described in the second embodiment. By removing the area of the nickel-chromium-containing layer 5 that was overlapped with the resist pattern 7 in a plane view, a conductive pattern that includes a plurality of wiring portions is manufactured. The wiring portion 2 after the step of removing the nickel-chromium-containing layer is as illustrated in FIG. 1.

[Regenerating Removal liquid]

In the step of regenerating the removal liquid in step S8, after the step of removing the nickel-chromium-containing layer, the regenerated removal liquid that has been used is contacted with the chelate resin to regenerate the regenerated removal liquid that has been used. Specifically, in the step of regenerating the removal liquid, the removal liquid that has been used is collected after the step of removing the nickel-chromium-containing layer, and the collected removal liquid is contacted with the chelate resin.

The chelate resin includes a functional group represented by formula (1) described below. By contacting the removal liquid with the chelate resin, the copper ions in the removal liquid can be adsorbed, so that the concentration of copper ions in the resulting regenerated removal liquid can be maintained at a low level. Therefore, it is possible to increase the lifetime of the removal liquid and to improve the effect of removing the nickel-chromium-containing layer, while preventing the progress of dissolution of the copper contained in the wiring portion in the step of removing the nickel-chromium-containing layer. In addition, even in the case of manufacturing a fine printed circuit board, peeling of the wiring portion can be prevented.

[Chem 5]

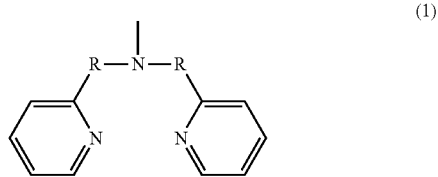

(1)

In formula (1), the Rs are identical divalent hydrocarbon groups having 1 to 5 carbons. A portion of the hydrogen atoms in the hydrocarbon groups may be substituted with halogen atoms.

Examples of the divalent hydrocarbon group having 1 to 5 carbons represented by R include a divalent chain hydrocarbon group having 1 to 5 carbons and a divalent alicyclic hydrocarbon group having 3 to 5 carbons. The chain hydrocarbon group may also be linear or branched.

Examples of the divalent chain hydrocarbon group include a divalent chain saturated hydrocarbon group, a divalent chain unsaturated hydrocarbon group, and the like.

Examples of the divalent chain saturated hydrocarbon group include a methanediyl group (—$CH_2$—), an ethanediyl group (—$C_2H_4$—), a propanediyl group (—$C_3H_6$—), a butanediyl group (—$C_4H_8$—), a dimethylethanediyl group (—$C_4H_8$—), a dimethyl methanediyl group (—$C_3H_6$—), a methyl ethanediyl group (—$C_3H_6$—), and the like.

Examples of the divalent unsaturated hydrocarbon group include an ethenediyl group (—$C_2H_2$—), a propenediyl group (—$C_3H_4$—), a butenediyl group (—$C_4H_6$—), a methylenemethanediyl group (—$C_2H_4$—), a methyleneethanediyl group (—$C_3H_4$—), a methylenepropanediyl group (—$C_4H_6$—), an ethylideneethanediyl group (—$C_4H_6$—), an ethynediyl group (—$C_2H_2$—), a propynediyl group (—$C_3H_2$—), a butynediyl group (—$C_4H_4$—), a vinylethynyl group (—$C_4H_2$—), an ethynylpropenediyl group (—$C_5H_4$—), a pentadiynediyl group (—$C_5H_2$—), and the like.

Examples of the divalent alicyclic hydrocarbon group include a divalent alicyclic saturated hydrocarbon group, a divalent alicyclic unsaturated hydrocarbon group, and the like.

Examples of the divalent alicyclic saturated hydrocarbon group include a cyclopropanediyl group (—$C_3H_4$—), a cyclobutanediyl group (—$C_4H_6$—), a cyclopentanediyl group (—$C_5H_8$—), and the like.

Examples of the divalent alicyclic unsaturated hydrocarbon group include a cyclopentenediyl group (—$C_5H_6$—), and the like.

Examples of the halogen atom which may substitute a portion of the hydrogen atoms in the hydrocarbon group include fluorine atom, chlorine atom, bromine atom, and iodine atom.

Preferably, the functional group is a bis (2-pyridylmethyl) amino group. When the chelate resin: includes a functional group represented by above formula (1), the effect of removing the nickel-chromium-containing layer can be further improved.

As a base material of the chelate resin, for example, polystyrene, a styrene-divinylbenzene copolymer, and the like may be used. As described above, the removal liquid is used in the step of removing the nickel-chromium-containing layer, and the copper dissolves from the laminated copper plating layer and the like, thereby increasing the concentration of copper ions in the removal liquid. When the chelate resin described above is used in the step of regenerating the regenerated removal liquid that has been used, the effect of reducing copper ions in the regenerated removal liquid that has been used is excellent.

As a method of contacting the chelate resin with the regenerated removal liquid that has been used, a publicly-known method using a chelate resin column can be used, for example. The chelate resin column is filled with the chelate resin. Then, the regenerated removal liquid that has been used is poured into the chelate resin column to remove copper ions from the regenerated removal liquid that has been used. As a method of contacting the chelate resin with the regenerated removal liquid that has been used, the chelate resin may be directly added into the regenerated removal liquid that has been used without using the chelate resin tower, and the chelate resin may be removed by filtration after a predetermined period of time, thereby performing regeneration process. As a method of contacting the chelate resin with the regenerated removal liquid that has been used, among these, it is preferable to use the chelate resin column in which the regenerated removal liquid that has been used and the chelate resin are efficiently contacted and copper ions can be removed in a short period of time.

Because only a finite amount of copper ions can be adsorbed by the chelate resin, the concentration of copper ions in the regenerated removal liquid can be adjusted by the ratio of the amount of the regenerated removal liquid that has been used to the amount of the chelate resin. It is preferable that the amount of the chelate resin is 50 L or more and 200 L or less for 200 L of the regenerated removal liquid that has been used.

The regenerated removal liquid may be used as the removal liquid in removing the nickel-chromium-containing layer from the substrate including the nickel-chromium-containing layer and a copper-containing layer. The regenerated removal liquid may be returned to the step of removing the nickel-chromium-containing layer in the previous step. In this case, the step of removing and the step of regenerating may be alternately and repeatedly performed for the same substrate to circulate the regenerated removal liquid. Alternatively, the regenerated removal liquid may be used in the step of removing the nickel-chromium-containing layer of other printed circuit board that may be subsequently performed. The regenerated removal liquid may be used by mixing with an unused removal liquid or a regenerated removal liquid that has been used.

Next, the regenerated removal liquid will be described.

As described above, the "regenerated removal liquid that has been used" refers to a removal liquid that has been used at least once in the step of removing the nickel-chromium containing layer, in which the concentration of copper ions is higher than that of an unused removal liquid. As the unused removal liquid, it is preferable that it contains chloride ions and has a pH of 1 or less. By removing the nickel-chromium-containing layer under strongly acidic conditions where the pH of the removal liquid is 1 or less, the effect of removing the nickel-chromium-containing layer can be further improved. Among the strong acids, hydrochloric acid is preferable because the passive film of the nickel-chromium-containing layer can be removed. As the unused removal liquid, an aqueous hydrochloric acid solution having a concentration of 5% by mass or more and 20% by mass or less is preferable.

The regenerated removal liquid is preferably an aqueous hydrochloric acid solution having a concentration of 5% by mass or more and 20% by mass or less.

The regenerated removal liquid preferably contains chloride ions and copper ions, has a pH of 1 or less, and has a concentration of the copper ions of 1 ppm or more and 2000 ppm or less, in order to maintain the effect of removing the nickel-chromium-containing layer well. When the regenerated removal liquid has a strong acidity of pH 1 or less, the effect of removing the nickel-chromium-containing layer can be further improved. Further, when the concentration of the copper ions of the regenerated removal liquid is in the range described above, it is possible to maintain the concentration of the copper ions of the regenerated removal liquid at a low level while improving the effect of removing the nickel-chromium-containing layer, and to increase the effect of preventing peeling of the wiring portion and preventing a short circuit due to a fall of the wiring portion.

Before the step of regenerating the removal liquid, the step of measuring the concentration of copper ions in the regenerated removal liquid that has been used may optionally be performed. When the measurement result indicates that the concentration of copper ions is the upper limit or less, the regenerated removal liquid that has been used may be used as is, and it is not necessary to perform the subsequent step of regenerating the removal liquid.

It is preferable that the regenerated removal liquid further contains a pyridine-based compound, and the concentration of the pyridine-based compound is more than 0 ppm and 5,000 ppm or less. According to the embodiment, the effect of removing nickel and chromium can be well maintained. When the concentration of the pyridine-based compound in the regenerated removal liquid is 5,000 ppm or less, the effect of inhibiting the removal of nickel and chromium by the pyridine-based compound can be reduced, and thus the effect of removing nickel and chromium can be well maintained.

When the line and space L/S in the conductive pattern is 5 µm/5 µm or more and less than 10 µm/10 µm, it is more preferable that the concentration of copper ions in the regenerated removal liquid is 30 ppm or more and 1000 ppm or less. When the line and space L/S is 10 µm/10 µm or more and less than 15 µm/15 µm, it is more preferable that the concentration of copper ions in the regenerated removal liquid is 30 ppm or more and 1500 ppm or less. Further, when the line and space L/S is 15 µm/15 µm or more and 20 µm/20 µm or less, it is more preferable that the concentration of copper ions in the regenerated removal liquid is 30 ppm or more and 2000 ppm or less.

The relationship of the concentration of copper ions in the regenerated removal liquid with respect to the line and space L/S described above is common to all of the removal liquids.

When the chelate resin includes a functional group represented by above formula (1), a small amount of the pyridine-based compound derived from the functional group described above may be formed in the regenerated removal liquid. The pyridine-based compound is a compound which is formed by decomposition of the chelate resin including the functional group represented by above formula (1). It is preferable that the concentration of the pyridine-based compound in the regenerated removal liquid is 0 ppm, or more than 0 ppm and 5,000 ppm or less. As described above, the presence of the pyridine-based compound in the regenerated removal liquid inhibits the removal of nickel and chromium. Therefore, by setting the concentration of the pyridine-based compound to the range described above, the effect of inhibiting the removal of nickel and chromium by the pyridine-based compound can be reduced, and thus the effect of removing nickel and chromium can be well maintained. When the line and space L/S in the conductive pattern is 5 µm/5 µm or more and less than 10 µm/10 µm, it is more preferable that the concentration of the pyridine-based compound in the regenerated removal liquid is 10 ppm or more and 3000 ppm or less. When the line and space L/S is 10 µm/10 µm or more and less than 15 µm/15 µm, it is more preferable that the concentration of the pyridine-based compound in the regenerated removal liquid is 10 ppm or more and 4,000 ppm or less. Further, when the line and space L/S is 15 µm/15 µm or more and 20 µm/20 µm or less, it is more preferable that the concentration of the pyridine-based compound in the regenerated removal liquid is 10 ppm or more and 5,000 ppm or less.

The relationship of the concentration of the pyridine-based compound in the regenerated removal liquid with respect to the line and space L/S described above is common to all of the removal liquids.

The method of manufacturing a printed circuit board according to the first embodiment include the step of regenerating the removal liquid that has been used, by contacting the removal liquid that has been used with the chelate resin including a functional group represented by the above formula (1), after the step of removing the nickel-chromium-containing layer. Because the concentration of copper ions in the regenerated removal liquid is reduced, it can be recycled as a regenerated removal liquid, and the lifetime of the removal liquid can be extended.

Second Embodiment

A method of manufacturing a printed circuit board according to a second embodiment of the present disclosure is a method of manufacturing a printed circuit board having a conductive pattern that includes a plurality of wiring portions, the method including: providing an insulating base film in which a nickel-chromium-containing layer is laminated directly or indirectly on a surface; laminating a resist pattern directly or indirectly on a surface of the nickelchromium-containing layer, after providing the base film; laminating a copper plating layer by plating on a part of the surface of the nickel-chromium-containing layer in which the resist pattern is not laminated, after laminating the resist pattern; removing the resist pattern, after laminating the copper plating layer; and removing, using a regenerated removal liquid, a part of the nickel-chromium-containing layer in which the copper plating layer is not laminated, after removing the resist pattern, wherein the regenerated removal liquid has been regenerated by contacting with a chelate resin, the chelate resin being a functional group represented by above formula (1). That is, the method of manufacturing a printed circuit board according to the second embodiment differs from the method of manufacturing a printed circuit board according to the first embodiment in that, in the step of removing the nickel-chromium-containing layer, the nickel-chromium-containing layer is removed using the regenerated removal liquid. The regenerated removal liquid according to the second embodiment is as described above.

The method of manufacturing the printed circuit board according to the second embodiment of the present disclosure includes a step of removing, using a regenerated removal liquid, a part of the nickel-chromium-containing layer in which the copper plating layer is not laminated. Accordingly, recycle of the removal liquid that has been used is attempted. In the method of manufacturing the printed circuit board, the regenerated removal liquid is obtained by contacting the removal liquid that has been used with the chelate resin. Accordingly, copper ions in the removal liquid that has been used are adsorbed by the chelate resin. As a result, because the concentration of the copper ions in the regenerated removal liquid is reduced, it is possible to improve the effect of removing the nickel-chromium-containing layer while preventing the progress of dissolution of the copper contained in the wiring portion in the step of removing the nickel-chromium-containing layer. As a result, it is possible to manufacture a printed circuit board in which peeling of the wiring portion is prevented using the regenerated removal liquid. This enables efficient use of the regenerated removal liquid that has been used and reduction of manufacturing costs.

OTHER EMBODIMENTS

The embodiments disclosed herein should be considered to be illustrative in all respects and not restrictive. The scope of the present disclosure is not limited to the configuration of the embodiments described above, but is set forth by the appended claims, and is intended to include all modifications within the meaning and scope equivalent to the claims.

In the embodiments described above, an unused removal liquid or a regenerated removal liquid is used as the removal liquid, but an unused removal liquid, a regenerated removal liquid, and a regenerated removal liquid that has been used may be used in any combination.

EXAMPLE

Although the present disclosure will be described in further detail below by way of example, the present disclosure is not limited to these examples.

[No. 1 to No. 14]

A base film consisting of a polyimide film with an average thickness of 25 μm was provided. A conductive pattern that includes 500 wiring portions arranged in parallel was formed on both sides of the base film by a semi-additive method. Specifically, first, a nickel-chromium-containing layer having an average thickness of 4 nm composed of nickel and chromium was laminated (the step of providing a base film). Then, a conductive layer having an average thickness of 0.2 μm composed of copper was laminated (the step of laminating a conductive layer).

Next, a photoresist film was laminated on substantially the entire surface of the conductive layer by thermocompression bonding of an acrylic dry film resist. Then, by selectively exposing the photoresist film with a photomask, a portion that dissolves in a developing liquid and a portion that does not dissolve in the developing liquid were formed on the photoresist film. Next, the portion that dissolves in the developing liquid was washed out using the developing liquid, so that the resist pattern having an opening corresponding to the formed region of the plurality of wiring portions is laminated. The step of laminating the photoresist film to the step of washing away the dissolved portion are included in the step of laminating the resist pattern.

Then, a copper plating layer having an average thickness of 10 μm was laminated by subjecting the surface of the conductive layer after the step of laminating the resist pattern to electrolytic copper plating in a copper sulfate plating bath at 25° C. containing 90 g/L of copper sulfate pentahydrate (the step of laminating a copper plating layer).

Then, after the copper plating layer was laminated, the resist pattern was removed using a resist removal liquid (the step of removing the resist pattern). The conductive layer in the region where the copper plating layer is not laminated was removed using a conductive layer removal liquid (the step of removing the conductive layer).

Then, the exposed nickel-chromium-containing layer was removed (the step of removing the nickel-chromium-containing layer). In the step of removing the nickel-chromium-containing layer, an unused removal liquid was used to remove the nickel-chromium-containing layer. The composition of the unused removal liquid was 15% hydrochloric acid, 10% sulfuric acid, a copper ion concentration of 50 ppm, and a pH of 1 or less. In the step of removing the nickel-chromium-containing layer, the substrate was immersed in the unused removal liquid at a liquid temperature of 45° C. The treatment time for removing the nickel-chromium containing layer was 30 seconds.

Then, in the step of regenerating the removal liquid, 50 L of a resin was filled into a chelate resin column, and the used removal liquid was passed at 10 L/min to remove copper ions. As the chelate resin, three types of chelate resins having a bis (2-pyridylmethyl) amino group, an iminodiacetic acid group, and an aminophosphate group, respectively, were used. The pH of the regenerated removal liquid was set to 1 or less in all cases.

As for the concentration of copper ions in the regenerated removal liquid, the concentration of copper ions in a sample liquid was quantified using n inductively coupled plasma (ICP) emission spectrometer.

The concentration of the pyridine-based compound in the regenerated removal liquid was determined as follows. The sample liquid was diluted with water and the absorbance at 263 nm was measured using an ultraviolet-visible spectrophotometer UV-1800 manufactured by Shimadzu Corporation. The concentration of the pyridine-based compound in the regenerated removal liquid was calculated from the calibration curve of bis (2-pyridylmethyl) amine prepared in advance.

The concentration of copper ions and the concentration of the pyridine-based compound in the regenerated removal liquid was changed by adjusting the concentration of copper ions in the used removal liquid and the number of times the used removal liquid was passed through the chelate resin and the like in the chelate resin column. Table 1 illustrates the concentration of copper ions and the pyridine-based compound in the regenerated removal liquid obtained (No. 2 to No. 14).

Next, the effect of removing the nickel-chromium-containing layer was measured using the unused removal liquid (No. 1) and the regenerated removal liquid (No. 2 to No. 14).

First, printed circuit boards with different values of line and space (L/S) [μm/μm] were prepared (No. 1 to No. 14). As a method of preparation, a step similar to the method of obtaining the regenerated removal liquid according to the embodiment described above was used. However, to change the value of line and space, the size of the opening of the resist pattern was adjusted.

No. 1 to No. 14 are obtained by performing up to the step of removing the conductive layer described above. The step of removing the nickel-chromium-containing layer was performed with respect to No. 1 to No. 14, using the unused removal liquid (No. 1) and the regenerated removal liquid (No. 2 to No. 14). As the regenerated removal liquid, a regenerated removal liquid, in which the unused removal liquid or the removal liquid that has been used were not mixed, was used. The step of removing the nickel-chromium-containing layer was performed in the same manner as the step of removing the nickel-chromium-containing layer described above, except that the unused removal liquid (No. 1) and the regenerated removal liquid (No. 2 to No. 14) were used.

For the printed circuit boards of samples No. 1 to No. 14 obtained after the step of removing the nickel-chromium-containing layer, the peeling occurrence rate of the wiring portion and the short circuit occurrence rate due to the nickel-chromium-containing layer residue were evaluated.

[Evaluation]
(Peeling Occurrence Rate of Wiring Portion)
For the printed circuit boards of No. 1 to No. 14, the peeling occurrence rate [%] of the wiring portion was determined by detecting the number of peeling occurrences by visual inspection.

(Short Circuit Occurrence Rate Due to Nickel-Chromium-Containing Layer Residue)
For the printed circuit boards of No. 1 to No. 14, the short circuit occurrence rate [%] due to the nickel-chromium-containing layer residue was determined by detecting the number of short circuit occurrences by electrical inspection.

Table 1 describes the evaluation results of the peeling occurrence rate of the wiring portion and the short circuit occurrence rate due to the nickel-chromium-containing layer residue.

TABLE 1

| TEST NUMBER | REGENERATED REMOVAL LIQUID | | | METAL LAYER PATTERN LINE AND SPACE L/S [μm/μm] | EVALUATION | |
|---|---|---|---|---|---|---|
| | FUNCTIONAL GROUP OF CHELATE RESIN | COPPER ION CONCENTRATION [ppm] | PYRIDINE-BASED COMPOUND CONCENTRATION [ppm] | | PEELING OCCURRENCE RATE OF WIRING PORTION [%] | SHORT CIRCUIT OCCURRENCE RATE DUE TO NICKEL-CHROMIUM-CONTAINING LAYER RESIDUE [%] |
| No. 1 UNUSED LIQUID (REFERENCE EXAMPLE) | — | — | — | 10/10 | 0 | 0 |
| No. 2 | BIS (2-PYRIDYLMETHYL) AMINO GROUP | 2000 | 0 | 10/10 | 0 | 0 |
| No. 3 | BIS (2-PYRIDYLMETHYL) AMINO GROUP | 2500 | 0 | 10/10 | 20 | 0 |
| No. 4 | BIS (2-PYRIDYLMETHYL) AMINO GROUP | 50 | 5000 | 10/10 | 0 | 0 |
| No. 5 | BIS (2-PYRIDYLMETHYL) AMINO GROUP | 2000 | 5000 | 10/10 | 0 | 0 |
| No. 6 | BIS (2-PYRIDYLMETHYL) AMINO GROUP | 0 | 5000 | 10/10 | 0 | 4 |
| No. 7 | BIS (2-PYRIDYLMETHYL) AMINO GROUP | 2000 | 6500 | 10/10 | 0 | 14 |
| No. 8 | BIS (2-PYRIDYLMETHYL) AMINO GROUP | 2500 | 6500 | 10/10 | 17 | 9 |
| No. 9 | BIS (2-PYRIDYLMETHYL) AMINO GROUP | 2500 | 6500 | 15/15 | 4 | 3 |
| No. 10 | BIS (2-PYRIDYLMETHYL) AMINO GROUP | 2500 | 6500 | 20/20 | 0 | 0 |
| No. 11 | BIS (2-PYRIDYLMETHYL) AMINO GROUP | 1000 | 3000 | 7/7 | 0 | 0 |

TABLE 1-continued

| TEST NUMBER | REGENERATED REMOVAL LIQUID | | | METAL LAYER PATTERN LINE AND SPACE L/S [μm/μm] | PEELING OCCUR-RENCE RATE OF WIRING PORTION [%] | EVALUATION SHORT CIRCUIT OCCURRENCE RATE DUE TO NICKEL-CHROMIUM-CONTAINING LAYER RESIDUE [%] |
|---|---|---|---|---|---|---|
| | FUNCTIONAL GROUP OF CHELATE RESIN | COPPER ION CONCEN-TRATION [ppm] | PYRIDINE-BASED COMPOUND CONCEN-TRATION [ppm] | | | |
| No. 12 | BIS (2-PYRIDYLMETHYL) AMINO GROUP | 2000 | 5000 | 15/15 | 0 | 0 |
| No. 13 | IMINODIACETIC ACID GROUP | 3500 | 0 | 10/10 | 47 | 0 |
| No. 14 | AMINOPHOSPHATE GROUP | 3500 | 0 | 10/10 | 44 | 0 |

As described in Table 1, No. 2 to No. 12 using the regenerated removal liquids regenerated with the chelate resin having a bis (2-pyridylmethyl) amino group in the step of removing the nickel-chromium-containing layer had a low peeling occurrence rate of the wiring portion, and the results were good. In particular, in No. 2, No. 4, No. 5, No. 11, and No. 12, no peeling of the wiring portion and no short circuit due to the nickel-chromium-containing layer residue were observed. In No. 2, No. 4, No. 5, No. 11, and No. 12, the concentration of copper ions in the regenerated removal liquid is 50 ppm or more and 2000 ppm or less, and the concentration of the pyridine-based compound is 5,000 ppm or less.

In contrast, No. 13 and No. 14 using the regenerated removal liquids regenerated with the chelate resin having an iminodiacetic acid group or an aminophosphate group in the step of removing the nickel-chromium-containing layer had a high peeling occurrence rate of the wiring portion.

As described above, according to the method of manufacturing a printed circuit board according to the present disclosure, the concentration of copper ions in the regenerated removal liquid can be maintained at a low level. As a result, it is possible to prevent the progress of the copper dissolution contained in the wiring portion in the step of removing the nickel-chromium-containing layer while improving the effect of removing the nickel-chromium-containing layer. Accordingly, it is demonstrated that a printed circuit board capable of extending the life of the removal liquid and preventing the peeling of the wiring portion can be obtained even when a fine printed circuit board is manufactured.

DESCRIPTION OF THE REFERENCE NUMERAL

1 Base film
2 Wiring portion
4 Copper plating layer
5 Nickel-chromium containing layer
6 Conductive layer
7 Resist pattern
8 Printed circuit board

The invention claimed is:

1. A method of manufacturing a printed circuit board having a conductive pattern that includes a plurality of wiring portions, the method comprising:

providing an insulating base film in which a nickel-chromium-containing layer is laminated directly or indirectly on a surface;
laminating a resist pattern directly or indirectly on a surface of the nickel-chromium-containing layer, after providing the base film;
laminating a copper plating layer by plating on a part of the surface of the nickel-chromium-containing layer in which the resist pattern is not laminated, after laminating the resist pattern;
removing the resist pattern, after laminating the copper plating layer;
removing, using a removal liquid, a part of the nickel-chromium-containing layer in which the copper plating layer is not laminated, after removing the resist pattern; and
regenerating the removal liquid that has been used in removing the nickel-chromium-containing layer, by contacting the removal liquid with a chelate resin,
wherein the chelate resin includes a functional group represented by a following formula (1):

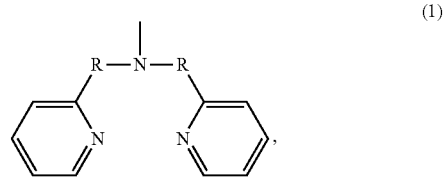

(1)

where a plurality of Rs are identical divalent hydrocarbon groups having 1 to 5 carbons, and some of hydrogen atoms in the hydrocarbon groups are substituted with halogen atoms or not substituted with a halogen atom.

2. The method of manufacturing the printed circuit board according to claim 1, further comprising:
laminating a conductive layer on the surface of the nickel-chromium-containing layer, after providing the base film and before laminating the resist pattern; and
removing the conductive layer, after removing the resist pattern and before removing the nickel-chromium-containing layer.

3. The method of manufacturing the printed circuit board according to claim 1, wherein the regenerated removal liquid, which is obtained in regenerating the removal liquid that has been used, includes chloride ions and copper ions, and has a pH of 1 or less, and the copper ions are present at a concentration of 1 ppm or more and 2,000 ppm or less.

4. The method of manufacturing the printed circuit board according to claim 3, wherein the regenerated removal liquid, which is obtained in regenerating the removal liquid that has been used, further includes a pyridine-based compound at a concentration of more than 0 ppm and 5,000 ppm or less.

5. The method of manufacturing the printed circuit board according to claim 1, wherein the functional group is a bis(2-pyridylmethyl) amino group.

6. A method of manufacturing a printed circuit board having a conductive pattern that includes a plurality of wiring portions, the method comprising:
   providing an insulating base film in which a nickel-chromium-containing layer is laminated directly or indirectly on a surface;
   laminating a resist pattern directly or indirectly on a surface of the nickel-chromium-containing layer, after providing the base film;
   laminating a copper plating layer by plating on a part of the surface of the nickel-chromium-containing layer in which the resist pattern is not laminated, after laminating the resist pattern;
   removing the resist pattern, after laminating the copper plating layer; and
   removing, using a regenerated removal liquid, a part of the nickel-chromium-containing layer in which the copper plating layer is not laminated, after removing the resist pattern,
   wherein the regenerated removal liquid has been regenerated by contacting with a chelate resin, the chelate resin including a functional group represented by a following formula (1):

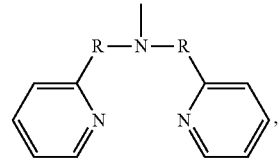

(1)

where a plurality of Rs are identical divalent hydrocarbon groups having 1 to 5 carbons, and some of hydrogen atoms in the hydrocarbon groups are substituted with halogen atoms or not substituted with a halogen atom.

* * * * *